(12) United States Patent  
Marki

(10) Patent No.: US 8,912,090 B2
(45) Date of Patent: Dec. 16, 2014

(54) MIXER FABRICATION TECHNIQUE AND SYSTEM USING THE SAME

(71) Applicant: Marki Microwave, Inc., Morgan Hill, CA (US)

(72) Inventor: Christopher Ferenc Marki, San Juan Bautista, CA (US)

(73) Assignee: Marki Microwave, Inc., Morgan Hill, CA (US)

(*) Notice: Subject to any disclaimer, the term of this patent is extended or adjusted under 35 U.S.C. 154(b) by 0 days.

(21) Appl. No.: 14/047,551

(22) Filed: Oct. 7, 2013

(65) Prior Publication Data

US 2014/0097882 A1    Apr. 10, 2014

Related U.S. Application Data

(60) Provisional application No. 61/710,994, filed on Oct. 8, 2012.

(51) Int. Cl.
| | |
|---|---|
| *H01L 21/00* | (2006.01) |
| *H01L 21/4763* | (2006.01) |
| *H03D 7/02* | (2006.01) |
| *H05K 3/30* | (2006.01) |
| *H05K 1/02* | (2006.01) |
| *H03H 1/00* | (2006.01) |
| *H05K 3/46* | (2006.01) |
| *H05K 1/03* | (2006.01) |
| *H05K 1/16* | (2006.01) |

(52) U.S. Cl.
CPC .............. *H03D 7/02* (2013.01); *H05K 3/4605* (2013.01); *H05K 3/30* (2013.01); *H05K 1/0306* (2013.01); *H05K 1/165* (2013.01); *H05K 2201/10174* (2013.01); *H05K 1/0243* (2013.01); *H03H 1/00* (2013.01)

USPC .............. 438/622; 438/48; 438/57; 327/356; 29/831

(58) Field of Classification Search
None
See application file for complete search history.

(56) References Cited

U.S. PATENT DOCUMENTS

| | | | |
|---|---|---|---|
| 5,819,169 A | 10/1998 | Fudem et al. | |
| 6,683,510 B1 * | 1/2004 | Padilla | ............................. 333/25 |
| 6,810,241 B1 * | 10/2004 | Salib | .............................. 455/326 |
| 7,577,416 B2 * | 8/2009 | Kimishima | .................... 455/313 |
| 2002/0008599 A1 | 1/2002 | Sridharan et al. | |
| 2007/0052491 A1 | 3/2007 | Kintis et al. | |
| 2012/0248587 A1 | 10/2012 | Alleaume et al. | |

FOREIGN PATENT DOCUMENTS

WO        02-052590 A2    7/2002

* cited by examiner

*Primary Examiner* — Seahvosh Nikmanesh
(74) *Attorney, Agent, or Firm* — McKenna Long & Aldridge LLP

(57) ABSTRACT

An improved microwave mixer manufactured using multi-layer processing includes an integrated circuit that is electrically connected to a top metal layer of a substrate. The microwave mixer includes: a first metal layer; a dielectric substrate on the first metal layer; a second metal layer directly on the substrate, at least two passive circuits arranged on the second metal layer and a top layer metal; a thin dielectric layer on the second metal layer, wherein the top layer metal is directly on the thin dielectric layer; an integrated circuit (IC) attached to the second metal layer, wherein the IC includes at least one combination of non-linear devices, and wherein the IC is directly connected to the passive circuits on the second metal layer; and a protection layer on the IC.

24 Claims, 7 Drawing Sheets (a)

(b)

(c)

MIXER FABRICATION TECHNIQUE AND SYSTEM USING THE SAME

This application claims priority to U.S. Provisional Application No. 61/710,994, filed on Oct. 8, 2012, which is hereby incorporated by reference for all purposes as if fully set forth herein.

FIELD OF THE INVENTION

The present invention relates in general to frequency mixers. More specifically, the present invention relates to microwave mixers and methods of manufacturing mixers having a compact design and improved electrical performance.

BACKGROUND OF THE INVENTION

Mixers are fundamental building blocks in electronics. A frequency mixer is a 3-port electronic circuit having two input ports and an output port. The mixer multiplies the two incoming electromagnetic signals to output the sum or difference frequency. Radio Frequency (RF) and microwave mixers are commercially available in a large number of styles, packages, and technology platforms ranging from discrete coaxial packages to gallium arsenide (GaAs) integrate circuits (ICs) to fully integrated silicon IC receivers.

Current mixer technology is best classified into two basic categories: hybrid mixers and monolithic mixers. Hybrid mixers are mixers that are manufactured using several different types of materials and manufacturing processes that are combined into a single package. Hybrid mixers are commonly made by attaching discrete semiconductor integrated circuits (ICs) to pre-etched substrates or onto multi-layer low temperature co-fired ceramic (LTCC) substrates. Advantages of hybrid mixers include performance (e.g., broad bandwidth, excellent conversion efficiency) and circuit sophistication. However, a drawback of hybrid mixers is that they are typically large sized, and their method of manufacture is not easily scalable to high volume automated assembly. Instead, hybrid mixers are more suitable for low-to-medium volume applications where a larger size is acceptable in order to achieve the highest available performance.

Monolithic mixers may serve as an alternative to hybrid mixers. With monolithic mixers, the entire mixer is manufactured on a single piece of semiconductor material. Specifically, monolithic mixers, which are built on materials like Silicon (Si), Silicon Germanium (SiGe) or Gallium Arsenide (GaAs), integrate passive mixer circuitry (i.e., baluns, filters networks, couplers, etc.) with IC devices on a single wafer. Monolithic mixers are well suited for high volume applications where size and cost are key factors. Unfortunately, monolithic mixers are inferior to hybrid mixers in terms of their overall performance and in terms of their circuit sophistication. More specifically, monolithic mixers cannot achieve the bandwidth of hybrid mixers because the passive circuits of the monolithic mixer, for example, baluns, are too highly coupled to the ground plane. GaAs wafers, for example, are only about 4 mil thick, implying that the planar monolithic baluns will have a high coupling to chip-ground, which results in a relatively low even mode impedance and a narrow band performance. The effect of the grounded substrate in the monolithic mixer can be partially offset by making the balanced transmission lines very close to each other which effectively lowers the odd mode impedance. However, that approach will force the line widths to shrink resulting in higher insertion loss. For these reasons, it is not practical to make passive monolithic mixers that have bandwidth greater than a few octaves.

Realizing the advantages and drawbacks of hybrid and monolithic mixers, there is a need for new mixer technology that can supply the performance and sophistication of existing hybrid mixers with the small size and highly integrated nature of monolithic mixers.

SUMMARY OF THE INVENTION

The present invention obviates the aforementioned deficiencies associated with hybrid and monolithic mixers by providing a mixer that is comparable in size to monolithic mixers, but still maintains the outstanding electrical performance typical of hybrid mixers.

One advantage of the present invention is that it is well suited for all types of applications, from low to high volume production.

Another advantage of the present invention is that it offers a high frequency limit that is superior to hybrid mixers, and has superior bandwidth capability. The mixer of the present application is ten times smaller than hybrid mixers operating at comparable frequencies, and has the same approximate weight as monolithic mixers.

Thus, in accordance with one aspect of the present invention, the above-identified and other advantages are achieved by a method of manufacturing an improved microwave mixer that includes sequentially forming a first metal layer, a substrate, and a second metal layer; patterning the substrate and first and second metal layers to form at least one interconnect that electrically contacts the first and second metal layers; patterning at least two passive circuits on the second metal layer of the substrate; patterning the second metal layer of the substrate to expose one or more portions of the substrate; forming a thin dielectric layer on the patterned second metal layer of the substrate, wherein the thin dielectric layer directly contacts the second metal layer and the exposed substrate; processing the thin dielectric layer to create dielectric vias; forming a top layer metal directly on the thin dielectric layer, wherein the top layer metal is connected to the first and second metal layers of the substrate by the dielectric vias formed in the thin dielectric layer; patterning the top layer metal and a portion of the thin dielectric layer to form the top layer metal of the passive circuits and to expose the substrate; attaching an integrated circuit (IC) to the second metal layer of the substrate, wherein the IC includes at least one combination of non-linear devices, and wherein the IC is directly connected to the passive circuits on the second metal layer of the substrate; and forming a protection layer on the IC.

In accordance with still another aspect of the present invention, the above-identified and other advantages are achieved by an improved microwave mixer. The microwave mixer includes: a first metal layer; a dielectric substrate on the first metal layer; a second metal layer directly on the substrate, wherein the substrate includes at least one substrate via electrically contacting the first metal layer and the second metal layer; at least two passive circuits arranged on the second metal layer and a top layer metal; a thin dielectric layer on the second metal layer, wherein the thin dielectric layer includes dielectric vias, wherein the top layer metal is directly on the thin dielectric layer and electrically connects the first and second metal layers of the substrate; an integrated circuit (IC) attached to the second metal layer, wherein the IC includes at least one combination of non-linear devices, and wherein the IC is directly connected to the passive circuits on the second metal layer; and a protection layer on the IC.

BRIEF DESCRIPTION OF THE DRAWINGS

Several figures are provided herein to further the explanation of the present application. More specifically.

DETAILED DESCRIPTION

Figure 1:
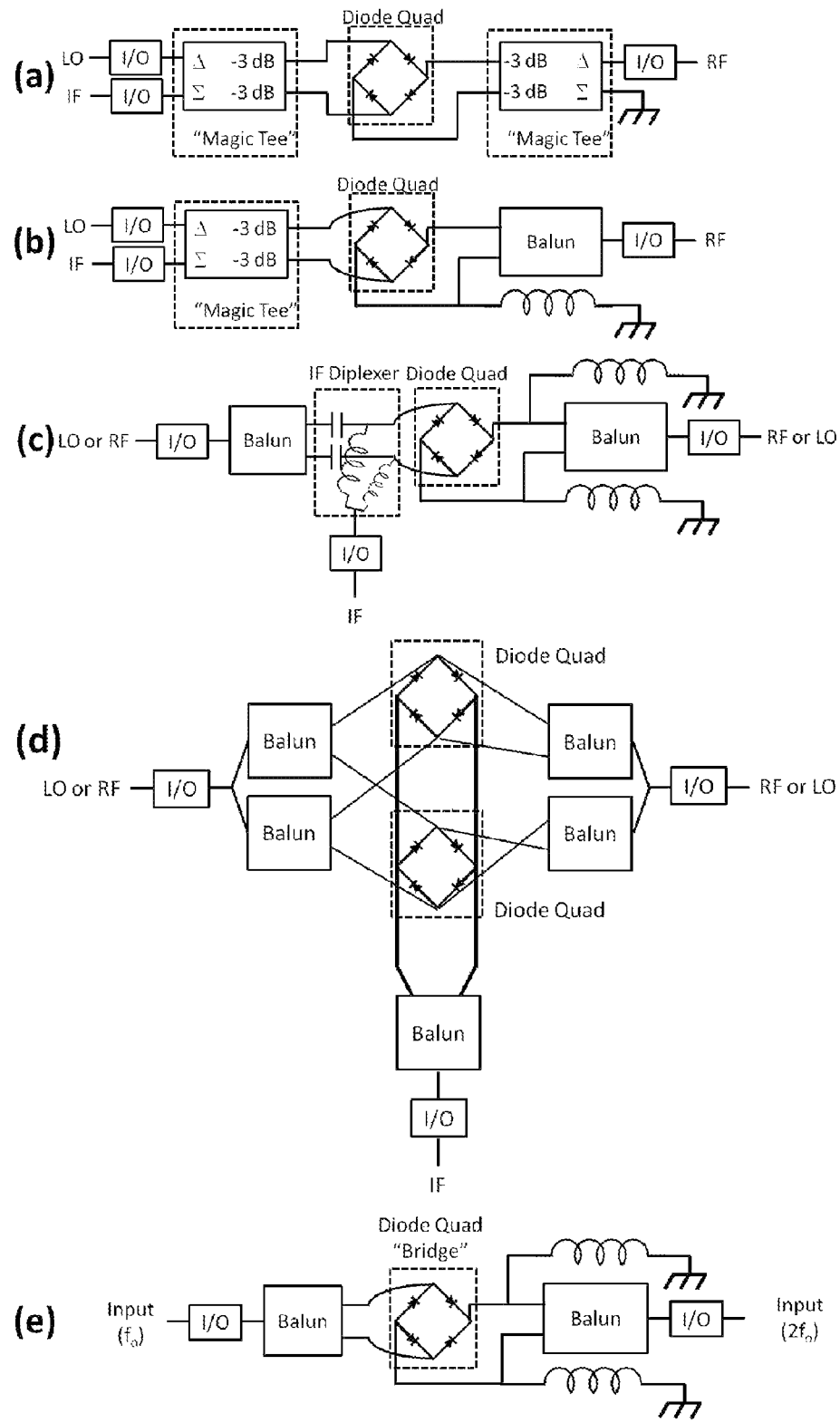
FIGS. 1A-1E illustrate examples of the circuitry for double and triple balanced mixers, and a balanced doubler circuit.

It is to be understood that both the foregoing general description and the following detailed description are exemplary. As such, the descriptions herein are not intended to limit the scope of the present invention. Instead, the scope of the present invention is governed by the scope of the appended claims.

Balanced mixers, whether hybrid or monolithic, are constructed by connecting integrated circuit (IC) devices, for example, Schottky diodes or field effect transistors (FETs) to surrounding passive circuitry. The surrounding passive circuitry most often consists of various combinations of elements, for example, inductors and capacitors, balanced transmission lines, Magic Tee couplers, and balanced to unbalanced (balun) converters. FIG. 1A illustrates a double balanced mixer circuit with two Magic Tee circuits. FIG. 1B illustrates a double balanced mixer circuit with a Magic Tee circuit on the local oscillator (LO) and intermediate frequency (IF) side and a balun on the radio frequency (RF) side with an IF direct current (DC) ground return. FIG. 1C illustrates a double balanced mixer circuit with two baluns and a diplexed IF. FIG. 1D illustrates an example of a triple balanced mixer circuit. Triple balanced mixers may be thought of as parallel driven double balanced (a.k.a. "doubly double balanced") mixers. Advantages of triple balanced mixers include: broader bandwidth, better linearity, and higher frequency IF in comparison to double balanced mixers.

And, FIG. 1E illustrates a balanced doubler circuit. The balanced doubler circuit is a two terminal device that "doubles" the frequency of an incoming signal (i.e., $f_{output}=2*f_{input}$). The balanced doubler circuit is efficient at generating the second harmoni of the input frequency, and the input frequency, called the "fundamental frequency" should not appear at the output port. FIG. 1E accomplishes efficient frequency doubling and fundamental rejection at the output by driving a diode "bridge" quad differentially using baluns. Specifically, the diode bride quad is similar to the diode "rings" in FIGS. 1A-1D, except that the orientation of the diodes is to have a common anode and common cathode. Thus, the circuitry in FIG. 1E is similar to the mixer circuitry in FIGS. 1A-1D in that various combinations of baluns, magic tees and diodes are used. However, in FIG. 1E, there is no third IF port. FIG. 1E can be manufactured using the process of the present invention.

The above passive circuitry includes passive devices that contain no source that can add energy to a signal. With mixers, the LO, illustrated as an input in FIGS. 1(A)-(D), adds energy. One of ordinary skill in the art of mixer design recognizes that the surrounding passive circuitry, especially the Magic Tees and baluns, governs the relative performance level of the mixer. Baluns and Magic Tees are inherently bandpass in nature and therefore determine the mixer bandwidth of operation. Normally, balun circuits have a broader bandwidth than Magic Tee circuits. So, the circuits illustrated in FIG. 1C and FIG. 1D typically have broader bandwidths than those in FIG. 1A, for example.

The actual configurations of the balanced mixers will depend on the performance requirements. However, each configuration offers improved performance when fabricated and implemented based upon the present invention. Mixers of the present invention designed to operate below 20 GHz are best built using planar spiral baluns. Mixers using passive spiral circuits can achieve 6:1 bandwidth and higher, and offer significant size reduction to comparable hybrid mixers. For example, a 6:1 bandwidth spiral balun centered at 10 GHz would comprised an area of approximately 0.040"×0.040", while a 6:1 bandwidth balun centered at 10 GHz in a hybrid mixer would comprise an area of 0.060"×0.200". Manufactured spiral balun mixers have been shown to operate, for example, from 2-12 GHz and 4-18 GHz with performance comparable to similar and much larger hybrid mixers.

For frequencies greater than 20 GHz, other baluns may be used. Broadside baluns, for example, (Marchand and Tapered) are compact in size and can achieve excellent performance above 20 GHz because quarter-wave sections are short at these frequencies. Owing to the high balanced line coupling afforded by a thin dielectric layer later described in this disclosure, these broadside baluns can achieve very broad bandwidth without the requirement for a suspended substrate. Moreover, the dielectric layer can be fine tuned to be thicker or thinner, depending on the impedance requirements, giving this manufacturing approach an important degree of freedom not available in standard monolithic foundries.

FIGS. 2(a) and 2(b), respectively, illustrate a microwave mixer and a method of manufacturing the microwave mixer, in accordance with exemplary embodiments of the present invention. As illustrated in FIGS. 2(a) and 2(b), the process generally involves forming the passive mixer circuitry, for example, the baluns and Magic Tees, and an integrated circuit (IC) in the multilayer stack-up.

Figure 2:
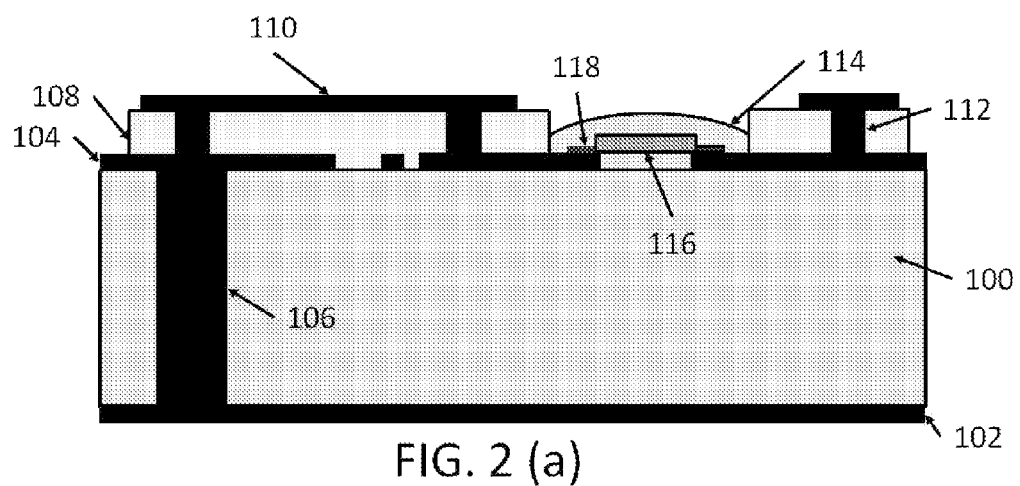
FIGS. 2(a) and 2(b) illustrate an exemplary microwave mixer and a method of manufacturing the microwave mixer according to an embodiment of the invention.
Figure 2:
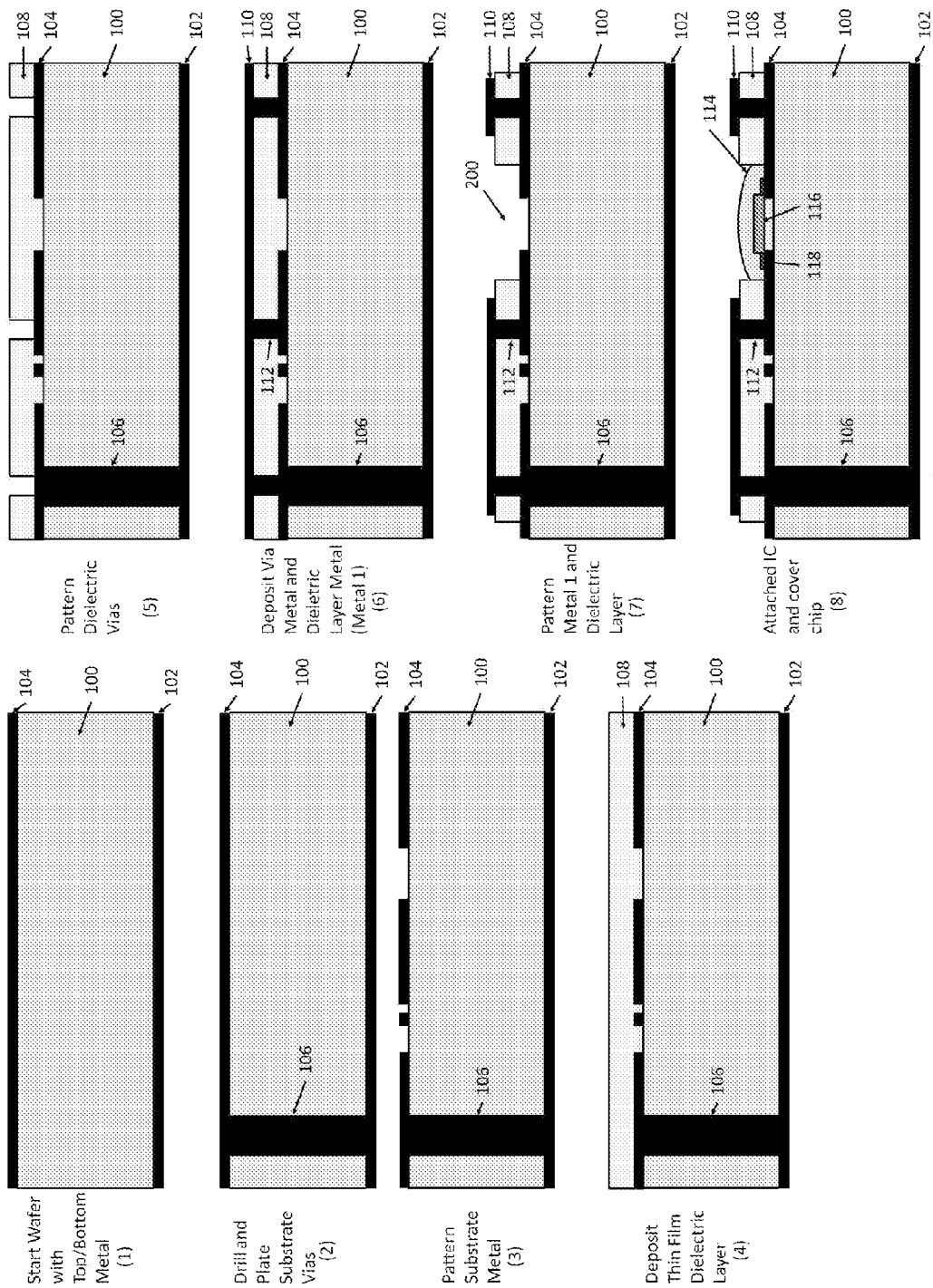

FIG. 2(a) illustrates a sectional view of a microwave mixer fabricated in accordance with the present invention. The process of the method of manufacturing the microwave mixer is illustrated in FIGS. 2(b)1-2(b)8.

In FIG. 2(b)1, a substrate 100 having top 104 and bottom 102 metal layers is illustrated. The preferred metal for the top 104 and bottom 102 layers is, for example, gold, sometimes with additional metallization to improve adhesion. Other metals may be used for the top and bottom metal layers, for example, copper or aluminum. The metal for the top 104 and bottom 102 metal layers has a preferable thickness in the range of about 2-5 microns.

The substrate 100 can be made of any material that is compatible with standard commercial thin film processing. For example, the material for the substrate 100 may include: Alumina, Quartz/Fused Silica, Aluminum Nitride, Beryllium Oxide, Ferrite/Garnet, Titanates, Glass, Sapphire, Silicon, or GaAs. The type of material and thickness of the substrate is generally a function of design or system requirements. Nevertheless, the preferred substrate material is Alumina due to cost, performance and the ability to be machined/processed by thin-film processing techniques. Further, the thickness of the substrate 100 is preferably between 5 mil and 60 mil. The substrate 100 should, however, be adequately thick to prevent wafer damage during fabrication. Also, the substrate 100 should be thick enough to achieve sufficiently high even mode impedance in the passive circuitry of the mixer.

In contrast, monolithic mixers are built on standard thickness semiconductor wafers. Hence, monolithic mixer substrates are dictated by the foundry, and the designer is relegated to using only the thickness that is available. Unfortunately, standard wafer thicknesses are not optimized for achieving the highest possible mixer performance. For example, standard 6 inch GaAs wafers are 4 mil thick. Owing to this relatively thin substrate geometry, and the high dielectric constant of GaAs (K=12.9), it is challenging to create high even mode impedence balun structures using standard IC processing techniques. Bandwidths for monolithic mixers are typically 3:1 or less. This is an inherent advantage of the present invention over prior art approaches to fabricating broadband mixers since thicker substrate thickness can be used, thereby achieving optimal broadband mixer performance by virtue of having higher even mode to odd mode impedance ratios.

In FIG. 2(b)2, the top metal layer 104 and the substrate 100 are processed to create substrate vias, such as via 106, that are filled using metal such as copper and/or gold. In this step, an electrical connection may be established between the top metal layer 104 and the bottom metal layer 102, wherein the latter is usually the ground plane. Although top metal layer 104 has been described as being connected, via 106, to bottom layer 102, additional other means may be used to ground the top metal layer 104.

Figure 3:
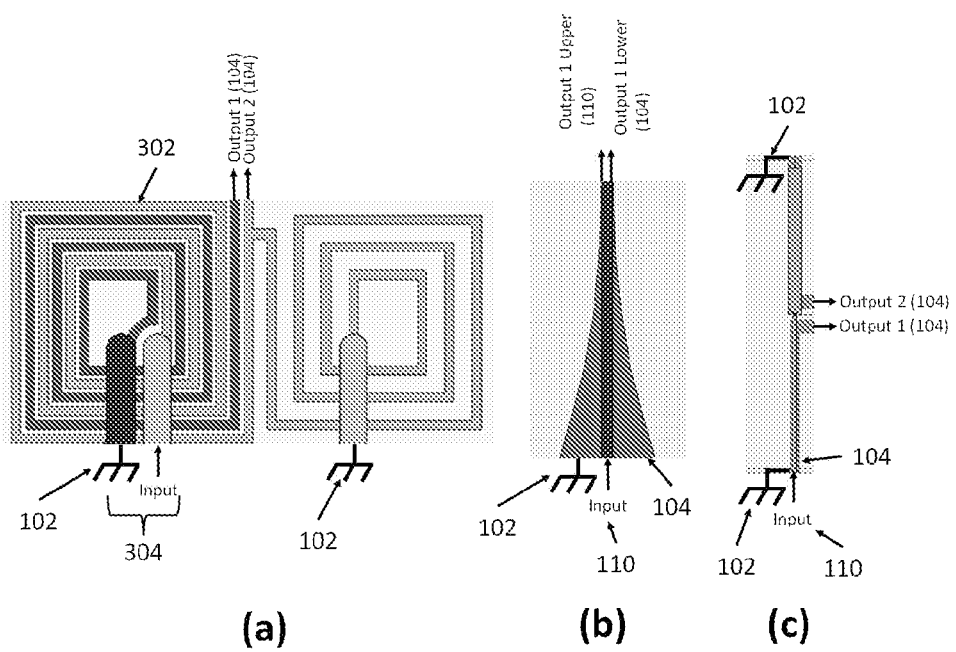
FIGS. 3(a)-3(c) illustrate examples of broadband baluns implemented using the stack-up process of FIGS. 2(a) and 2(b)

In FIG. 2(b)3, thin-film processing allows for very fine metal patterning, especially when compared to standard PCB and low temperature co-fired ceramic (LTCC) processing. For example, typical PCB processing specifies line with gap features on the order of 0.004" and 0.003". In the present invention, the metals for the passive circuits are patterned using processing methods that can achieve trace widths and gaps as small as 0.0005" (0.5 mil). For example, such fine lines and gaps permit the creation of planar spiral balun structures that are extremely compact. Moreover, the spiral baluns having the small trace widths and gaps experience improved coupling through magnetic field enhancement. In the present invention, the tightly coupled spirals of, for example, the spiral baluns, are printed on the top substrate metal layer 104 in a single processing step, offering a technical advantage over previous mixers that included "multi-layer" or broadside coupled spirals because fewer steps are necessary, and fewer processing errors are possible. Typically, the more layers required for processing, the bigger the risk for assembly mistakes. Nonetheless, it is possible, using the present invention to create either single layer spiral baluns or multilayer spiral baluns, based upon design criterion, on the top metal layer 104.

Figure 4:
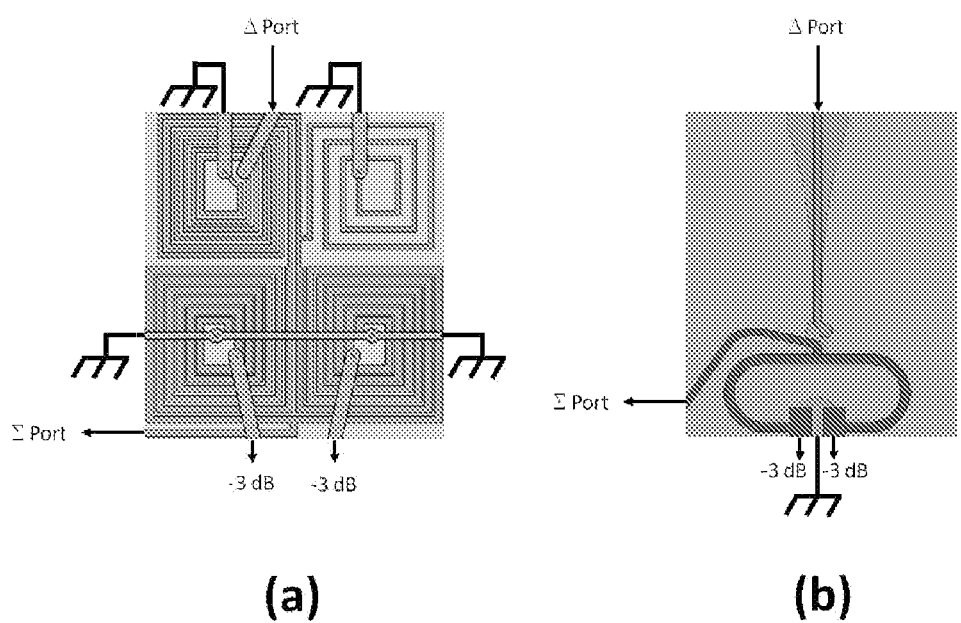
FIGS. 4(a) and 4(b) illustrate broadband Magic Tees implemented using the stack-up process of FIGS. 2(a) and 2(b)

As illustrated in FIG. 2(b)4, a thin film dielectric layer 108 can be deposited on the patterned substrate metal layer 104. Materials like polyimide and bisbenzocyclobutene (BCB) are ideally suited to make thin film dielectric layer 108 on substrate 100. The advantages associated with materials such as polyimide and BCB are that such materials exhibit low dielectric constants, can be spin coated to various thicknesses, are environmentally stable, can be used as a protective layer, can be photo-lithographically patterned/etched after curing, and can be metalized. Thin film dielectric layer 108 on, for example, an Alumina substrate serves as an ideal platform for transmission lines because transmission lines can be routed in quasi-3D topologies using easily fabricated vias, and they can also facilitate the fabrication of very broadband balun structures. In general, balun bandwidth is proportional to the ratio of even-mode to odd-mode impedance. One way to achieve a high ratio is to pattern "broadside coupled lines" separated by a very thin dielectric layer. In hybrid mixers, it is common to use 5 mil thick PTFE or Teflon® materials to achieve this high even-mode/odd-mode impedance ratio. Using thin film deposition of the present invention, a thin film dielectric material, like polyimide, has a thickness of 5 microns to 20 microns, representing a 25-times decrease in the film thickness used for hybrid mixers. The even to odd mode impedance ratio increases as the thin film thickness decreases. And, the even to odd mode impedance is directly proportional to the bandwidth. Thus, a thinner thin film dielectric layer 108 results in increased bandwidth.

However, there are practical trade-offs between how thin and how thick the dielectric layer 108 should be. In the present invention, the preferred thickness of the dielectric layer 108 is 5 micron-20 micron. A dielectric layer 108 outside this preferred range results in reduced performance of the microwave mixer of the present invention. In particular, if the dielectric film 108 is less than 5 micron, parasitic capacitance between the lines of the passive circuitry increases. The increased parasitic capacitance thus, limits the bandwidth of the baluns and Magic Tees. Thus, the dielectric layer 108 should be thick enough to limit the parasitic capacitance. Additionally, if the thickness of the dielectric layer 108 is decreased too low, then high impedance cannot be attained and the proper impedance for the line widths of the baluns and Magic Tees cannot be maintained.

With respect to the upper value for the thickness range for the dielectric layer 108, there are several disadvantages to having the thickness of the dielectric layer 108 greater than 20 micron. For example, if the dielectric layer 108 is greater than 20 micron, then the even mode/odd mode impedance ratio is limited. Specifically, the low impedance cannot be attained. Because the even mode/odd mode ratio is proportional to bandwidth, if the even mode/odd mode ratio is reduced, then the bandwidth is also reduced. Thus, the best performance for the microwave mixer of the present invention is achieved by the dielectric layer 108 having a thickness between 5 micron and 20 micron.

Figure 5:
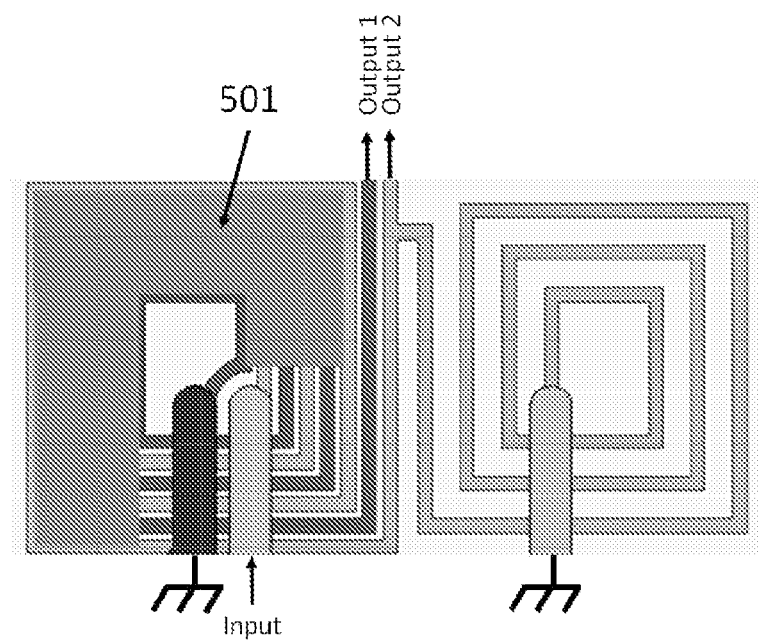
FIG. 5 illustrates an exemplary embodiment of the invention similar to the Magic Tee of FIG. 4(a) that includes a metal overlay.

Next, in FIG. 2(b)5, the thin film dielectric layer 108 is patterned. The dielectric vias 112 facilitate the interconnection of, for example, the substrate bottom metal layer 102, and the substrate top metal layer 104 to other layers on the substrate 100. The thin film dielectric layer 108 is patterned and etched using standard processing, and no complex drilling is necessary (unlike thick film and LTCC processing). Dielectric vias 112 are easily accommodated and have a smaller diameter than the substrate vias 106. The dielectric vias can be made extremely small, for example, as small as 1 mil diameter. Small via diameter helps reduce circuit size and promotes high frequency operation by limiting parasitic.

Figure 6:
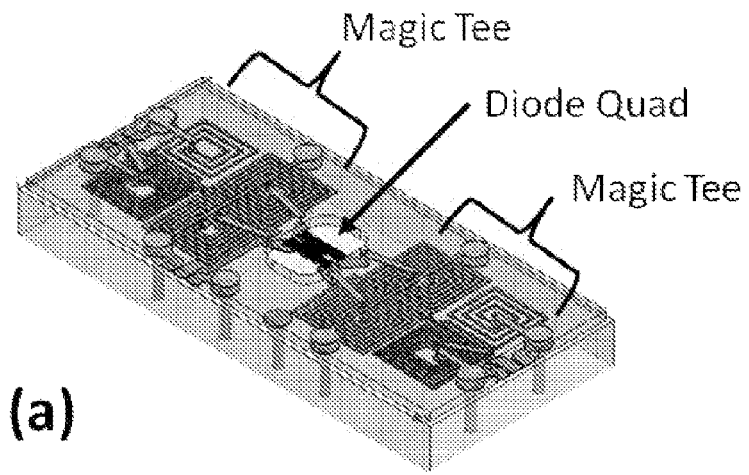
FIGS. 6(a)-6(c) illustrate three embodiments of mixers fabricated in accordance with the invention.
Figure 6:
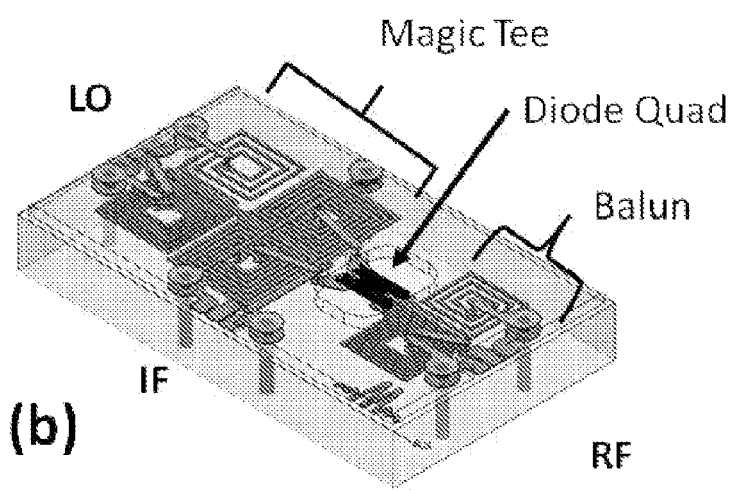
Figure 6:
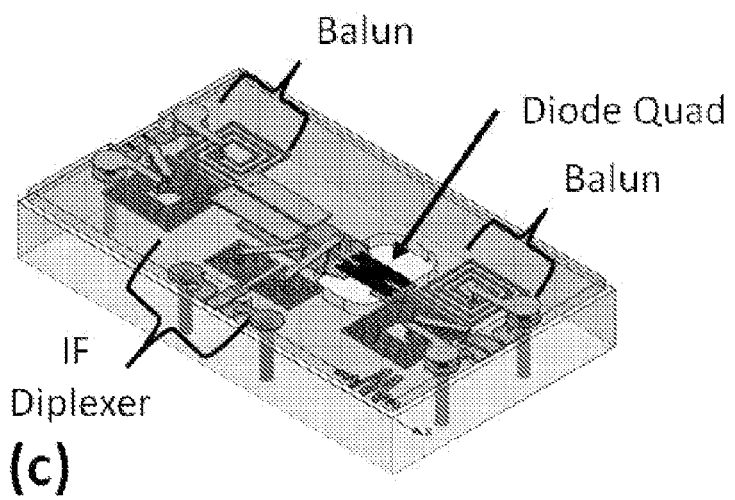

In FIG. 2(b)6, a metal layer 110 such as gold, is deposited in the dielectric vias 112 created in FIG. 2(b)5 and creates a layer of metal 110 on the top side of the dielectric layer 108.

The metal layer 110 is the "top layer" metal for the passive circuitry, for example, the baluns and Magic Tees. This top layer metal 110 can serve several purposes. First, the top layer metal 110 can be used to make "bridges", such as those that are needed in planar spiral baluns and Magic Tees. In that case, the top layer metal 110 forms the upper routing layer of the spiral balun. Lines printed on the top layer metal 110 can transfer signals between nodes of the passive circuit. This is critical for optimal layout and allows for the implementation of planar spiral baluns using thin film techniques. The top layer metal 110 can be patterned to form the top layer for broadside coupled baluns. The balun may be formed partially on the substrate top metal layer 104, and partially on the top layer metal 110. This kind of balun is preferred because the even-mode impedance is very large, facilitating very broadband balun structures because the substrate is many times thicker than the dielectric.

In FIG. 2(*b*)7, the top layer metal 110 and a portion of the thin film dielectric layer 108 are patterned in an area 200 in which an integrated circuit (IC) will be attached. The IC includes at least one combination of nonlinear devices, for example, a diode quad that, after attached, is also connected to the passive circuitry, ie., baluns and/or Magic Tees that are formed on the substrate top metal layer 104 and the top layer metal 110. For example, passive circuitry and the IC can be one of the circuits illustrated in FIGS. 1A-1E.

It would be appreciated that more than one thin film dielectric layer and/or more than one top layer metal may be formed in the microwave mixer and are within the scope of the present invention.

Next, in FIG. 2(*b*)8, the IC is attached and optionally covered to protect the IC. In a preferred embodiment, the IC is in a beam lead die 116. The beam leads are bonded, by for example, thermo-compression, directly to exposed die attach point 118 (i.e., pads) on the substrate top metal layer 104. After the IC 116 is attached, a droplet of epoxy 114 or a thin film coating can be placed on the top of the IC 116 for protection. The IC 116 may be attached in "chip form". This means that it is a bare, singulated die which can be attached using epoxy or an eutectic die attachment. The IC bond pads are subsequently connected to the bond pads 118 on the substrate top metal layer 104 using standard wire bonding techniques. Another attachment approach for the IC 116 would be to use "flip-chip" bonding of a solder bumper IC. Whichever means of attachment is used, the IC will always be electrically connected to the substrate top metal layer 104, as is made possible by making the window 200 in the dielectric layer 108 to expose the substrate top metal layer 104 below the dielectric layer 108.

Placing the IC 116, including for example a diode quad, on the substrate metal layer 104 as disclosed in the present invention provides a high degree of mechanical robustness and reliability. Specifically, when the diode IC 116 is bonded to the substrate 100 either through direct wire bonding from metal pads on the circuit to metal pads on the IC, or through thermo-compression bonding of beam lead ICs to the circuit pads, the adhesion strength of the metal on the substrate metal layer is much stronger than the adhesion of the metal to a top dielectric layer. The bonding technique typically involves physical pressure and heat to bond metal to other metals. The preferred technique of the present invention is to use gold to gold bonding. However, other metals, for example, aluminum, can be used for the bonding. In beam leaded diodes, for example, a sharp "bonding tip" pushes the gold tab of the diode into the gold pad of the circuit board. Under heat and pressure, these two separate gold elements bond together creating a strong metal attachment. If the material below the gold pad is physically soft, it is not possible to create sufficient pressure between the two gold pieces to cause strong bonding. Thin film materials, like polyimide, are soft materials. While materials such as Alumina, are extremely hard. Thus, in the present invention, the metal to metal bond is stronger between the IC and the substrate metal layer than if the IC were attached to a top layer of dielectric material.

Further, placing the IC 116 on the substrate metal layer 104 provides a higher coefficient of thermal expansion (CTE). Typically, electronic hardware used in commercial and military applications must withstand temperatures ranging from −55 C. to more than 100 C. This large operating temperature range requires that the connection of the diode IC to the substrate circuit must be very strong and resilient over time and temperature. To address the issue of the electronic hardware's exposure to large temperature fluctuations, materials that have similar CTE can be used. This is particularly critical when packaging and bonding IC diode chips because such chips are thin, fragile and prone to cracking under applied stress. In the present invention, alumina, which may be used for the material of the substrate, has a CTE of 6-8 ppm per degree C., which is similar to the most common semiconductors that are used to make the diode ICs (i.e, silicon has CTE of 2.6 ppm/C and GaAs has a CTE of 6.86 ppm/C). Thus, the CTE of the substrate metal is similar to the CTE of the IC and would result in a highly reliable bond. Whereas, a dielectric layer of polyimide has a CTE of 35 ppm/C and BCB has a CTE of 42 ppm/C. As such, if the diode IC is attached to the dielectric layer such as polyimide or BCB, there would be a high thermal expansion mismatch. This large CTE mismatch would impose extra stress on the IC chip and promote accelerated performance failures over time and temperature.

Mixer bandwidth is dictated by the bandwidth of the surrounding circuitry, specifically the bandwidth of the baluns and Magic Tees. The following circuits yield broadband performance and are the preferred devices for use in the present invention:

1. Edge coupled spiral baluns which are illustrated in FIG. 3*a*. By making the gap spacing close, a high even mode and low odd mode impedance can be achieved, making for broadband operation. Balun compensation can be achieved by using an extra spiral that is connected to ground. The compensation element acts like an inductor to ground. In FIG. 3*a*, the spirals 302 of the balun would be formed on the substrate top metal layer 104 in FIGS. 2(*a*) and 2(*b*), while the input and ground would be the top layer metal 110 and substrate bottom metal layer 102, respectively, in FIGS. 2(*a*) and 2(*b*).
2. Broadside coupled tapered balun (FIG. 3*b*). The element numbers 102, 104 and 110 from FIGS. 2(*a*) and 2(*b*), have been used to indicate the correlation of the substrate bottom metal layer (ground) 102, the substrate top metal layer 104, the top layer metal 110. The thin dielectric film allows for high coupling between the layers, facilitating broadband balun performance. The input line can also be compensated back to ground (not pictured)
3. Broadside coupled Marchand balun (FIG. 3*c*). Elements 102, 104 and 110, respectively, are patterned to create two quarter-wave sections of highly coupled lines. Broadside coupling yields high coupling values and hence broadband performance.
4. Edge coupled spiral Magic Tee (FIG. 4*a*). This Magic Tee is a 4 port circuit that is used to route IF and LO signals into, and out of the diodes of the mixer. Broadband performance is possible based upon the tight edge coupled between the small gap. This circuit is inherently well balanced due to excellent balanced line compensation.
5. Broadside coupled Magic Tee with Tapered Balun (FIG. 4*b*). Broadside coupled transmission lines route LO and IF signals into, and out of the diodes. Tight coupling creates broad bandwidth. In theory, the tapered balun portion of this circuit can be replaced by any other balun, including the spiral balun in FIG. 3a, and the Marchand balun in FIG. 3c.

FIG. 5 illustrates an alternate embodiment in which a metal overlay 501 is added over, for example, a spiral balun as illustrated in FIG. 3a, to enhance performance by re-entrant mode coupling. The metal overlay 501 is the same material and formed at the same time as the top layer metal 110 in process step FIG. 2(b)6. The metal overlay 501 may be used to improve the phase and amplitude balance of the spirals, and increase the even/odd mode impedance ratio; therefore, improving the bandwidth of the balun. The use of spiral baluns also provides a more compact structure. Thus, adding the metal overlay 501 creates high coupling and short length, which in turn simultaneously permits broad bandwidth and high frequency. The metal overlay 501 can be applied to any of the spiral baluns and spiral Magic Tees described in FIGS. 3 and 4. In FIG. 5, the metal overlay 501 is illustrated to overlap a large portion of the spirals; however, any portion or all of the spirals may be overlapped by the metal overlay 501. More overlap of the metal overlay 501 and the spirals results in increased coupling and bandwidth. Because the metal overlay 501 may be patterned during processing step FIG. 2(b)6 using top metal layer 110, no separate processing steps are necessary in the stack-up to make the metal overlay 501.

FIGS. 6(a)-6(c) illustrate completed mixers fabricated in accordance with the present invention. In particular, FIG. 6(a) illustrates a double balanced mixer having the circuitry of FIG. 1(a) including two mirrored Magic Tees and a diode quad. While FIG. 6(b) illustrates a double balanced mixer having a Magic Tee and a balun circuit illustrated in FIG. 1(b); and FIG. 6(c) illustrates a double balanced mixer having mirrored baluns and an integrated LC diplexer to decouple the IF signal, similar to the circuit in FIG. 1(c). Each of the completed mixers in FIGS. 6(a)-6(c) is manufactured using the stack-up described in FIGS. 2(a) and 2(b) such that the IC is always electrically connected to the top metal layer 104 of the substrate.

Table 1 below provides a comparison of the improved mixer technology of the present invention to typical hybrid and monolithic mixers.

TABLE 1

|  | Hybrid Mixer | Monolithic Mixer | Mixer Fabricated in accordance with an embodiment of invention | Observations |
| --- | --- | --- | --- | --- |
| Package Area | 0.320" × 0.320 | 0.120" × 0.120" | 0.150" × 0.090 | Invention is more than 10x smaller than traditional hybrid mixers, and comparable to monolithic mixers. |
| LO Power | +7 dBm | >+13 dBm | +7 dBm | Invention uses diodes as hybrid mixers, and is thus more power efficient than higher power consumption monolithic mixers. |
| Bandwidth | 10:1 | 3:1 | 6:1 | Invention has superior bandwidth capability than monolithic mixers |
| High Frequency Unit | ~65 GHz | 100's GHz | 100's GHz | High frequency limit is superior to hybrid mixers due to higher precision fabriccation and smaller feature sizes |
| Development Cost ($) | 2-5k | 50-100k | 5-10k | Fixed costs are an order of magnitude cheaper for new designs compared to monolithic mixers |
| Development Lead Time | Days to Weeks | Months to Years | Weeks to Months | Invention can be designed, fabricated and tested within weeks, as opposed to many months for monolithic mixers |
| Volume Production Cost | High | Low | Low to Medium | Invention eliminates many tedious hand assembly steps compared to hybrid mixers, thereby resulting in better volume pricing. Most assembly step can be fully automated. |
| Target Volume | Low to Medium | Medium to High | Low to High | Invention is well suited for applications, from low to high volume. Development costs are comparable to hybrid mixers, which is ideal for low volume/custom applications, and the high volume manufacturing can be automated due to limited hand assembly, thus enabling volume ramp-up. |
| Circuit Complexity | High | Low | High | Invention can realize complex mixer circuits, previously only attempted in hybrid mixers, invention is not limited by restrictive and rigid design guidelines, which is a limitation for monolithic mixer development. |
| Repeatability | Adequate | High | High | Since most of the assembly is automated, with limited hand assembly, repeatability is excellent and comparable to monolithic manufacturing techniques. |
| Customizability | High | Low | High | Low design cost, quick lead times, and the ability to make complex circuits make the invention ideal for custom requirements. |
| Nonlinear Devices | Any vendor Many Choices | IC Choice limited by foundry | Any Vendor Many Choices | In monolithic work, the designer is limited to using whichever IC is offered by the foundry (usually a FET). In this invention, the designer can select from any device that will result in BEST achievable performance. Therefore performance will not be limited by nonlinear device, which is often the case in monolithic mixers. |
| Substrate Material | Duroid | Semiconductor (usually GaAs) | All thin-film compatible (Alumina, Quartz, etc) | Invention can be fabricated on a variety of materials giving the designers an extra degree of freedom to tailor performance. Invention also incorporates a metal-backed solid substrate design, which is ideal for "chip and wire" and surface mount packaging. Most hybrid mixers use "suspended substrate" packaging, which is problematic. |

The present invention has been described above in terms of a preferred embodiment and one or more alternative embodiments. Moreover, various aspects of the present invention have been described. One of ordinary skill in the art should not interpret the various aspects or embodiments as limiting in any way, but as exemplary. Clearly, other embodiments are well within the scope of the present invention. The scope of the present invention will instead be determined by the appended claims.

I claim:

1. A multilayer fabrication method for a microwave mixer, comprising:
   sequentially forming a first metal layer, a substrate, and a second metal layer;
   patterning the substrate and first and second metal layers to form at least one interconnect that electrically contacts the first and second metal layers;
   patterning at least two passive circuits on the second metal layer of the substrate;
   patterning the second metal layer of the substrate to expose one or more portions of the substrate;
   forming a thin dielectric layer on the patterned second metal layer of the substrate, wherein the thin dielectric layer directly contacts the second metal layer and the exposed portion of the substrate;
   processing the thin dielectric layer to form dielectric vias;
   forming a top layer metal directly on the thin dielectric layer, wherein the top layer metal is connected to the first and second metal layers of the substrate by the dielectric vias formed in the thin dielectric layer;
   patterning the top layer metal and a portion of the thin dielectric layer to form the top layer metal of the passive circuits and to expose the substrate;
   attaching an integrated circuit (IC) to the second metal layer of the substrate for the microwave mixer, wherein the IC includes at least one combination of non-linear devices, and wherein the IC is directly connected to the passive circuits on the second metal layer of the substrate; and
   forming a protection layer on the IC.

2. The multilayer fabrication method for a microwave mixer according to claim 1, further comprising forming a metal overlay on a top surface of at least one of the passive circuits.

3. The multilayer fabrication method for a microwave mixer according to claim 2, wherein forming the metal overlay comprises forming the metal overlay such that it overlaps a portion of the top surface of the at least one passive circuits.

4. The multilayer fabrication method for a microwave mixer according to claim 1, wherein the substrate material is one of alumina, quartz/fused silica, aluminum nitride, beryllium oxide, ferrite/garnet, titanates, glass, sapphire, silicon and gallium arsenide.

5. The multilayer fabrication method for a microwave mixer according to claim 1, wherein the substrate has a thickness between 5 mil and 60 mil.

6. The multilayer fabrication method for a microwave mixer according to claim 1, wherein the first metal layer and the second metal layer include at least one of gold, copper and aluminum.

7. The multilayer fabrication method for a microwave mixer according to claim 1, wherein the thin film dielectric layer includes polyimide or bisbenzocyclobutene (BCB).

8. The multilayer fabrication method for a microwave mixer according to claim 1, wherein the thin film dielectric layer has a thickness of about 5-20 microns.

9. The multilayer fabrication method for a microwave mixer according to claim 1, wherein the passive circuits include spiral and broadside baluns and spiral and broadside Magic Tees, and the non-linear devices include diodes and field effect transistors.

10. The multilayer fabrication method for a microwave mixer according to claim 1, wherein the IC is connected to the second metal layer of the substrate via a beam lead die.

11. The multilayer fabrication method for a microwave mixer according to claim 1, wherein the protection layer includes epoxy.

12. The multilayer fabrication method for a microwave mixer according to claim 1, further including metal overlay positioned on a top surface of the passive circuits.

13. A microwave mixer, comprising:
    a first metal layer;
    a dielectric substrate on the first metal layer;
    a second metal layer directly on the substrate, wherein the substrate includes at least one substrate via electrically contacting the first metal layer and the second metal layer;
    at least two passive circuits arranged on the second metal layer and a top metal layer;
    a thin dielectric layer on the second metal layer, wherein the thin dielectric layer includes dielectric vias, wherein the top layer metal is directly on the thin dielectric layer and electrically connects the first and second metal layers of the substrate using the dielectric vias;
    an integrated circuit (IC) attached to the second metal layer for the microwave mixer, wherein the IC includes at least one combination of non-linear devices, and wherein the IC is directly connected to the passive circuits on the second metal layer; and
    a protection layer on the IC.

14. The microwave mixer of claim 13 wherein the substrate material is one of alumina, quartz/fused silica, aluminum nitride, beryllium oxide, ferrite/garnet, titanates, glass, sapphire, silicon and gallium arsenide.

15. The microwave mixer of claim 13, wherein the substrate has a thickness between 5 mil and 60 mil.

16. The microwave mixer of claim 13, wherein the first metal layer and the second metal layer include at least one of gold, copper and aluminum.

17. The microwave mixer of claim 13, wherein the thin film dielectric layer includes polyimide or bisbenzocyclobutene (BCB).

18. The microwave mixer of claim 17, wherein the thin film dielectric layer has a thickness of about 5-20 microns.

19. The microwave mixer of claim 13, wherein the passive circuits include spiral and broadside baluns, and spiral and broadside Magic Tees, and the non-linear devices include diodes and field effect transistors.

20. The microwave mixer of claim 13, wherein the IC is connected to the second metal layer via a beam lead die.

21. The microwave mixer of claim 13, wherein the protection layer includes epoxy.

22. The microwave mixer of claim 13, further including a metal overlay positioned on a top surface of at least one of the passive circuits.

23. The microwave mixer of claim 22, wherein the metal overlay overlaps a portion of the at least one of the passive circuits.

24. The microwave mixer of claim 13, wherein the first metal layer is grounded.

* * * * *